(12) United States Patent
Li et al.

(10) Patent No.: US 11,711,948 B2
(45) Date of Patent: Jul. 25, 2023

(54) DISPLAY PANEL, PREPARATION METHOD THEREOF, AND DISPLAY APPARATUS

(71) Applicant: BOE TECHNOLOGY GROUP CO., LTD., Beijing (CN)

(72) Inventors: Shipei Li, Beijing (CN); Sheng Xu, Beijing (CN); Wei He, Beijing (CN); Ying Zhao, Beijing (CN); Huili Wu, Beijing (CN); Fang He, Beijing (CN); Renquan Gu, Beijing (CN); Lizhen Zhang, Beijing (CN); Yi Zhou, Beijing (CN); Wusheng Li, Beijing (CN); Qi Yao, Beijing (CN); Yang Yue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 86 days.

(21) Appl. No.: 17/319,409

(22) Filed: May 13, 2021

(65) Prior Publication Data

US 2022/0093710 A1    Mar. 24, 2022

(30) Foreign Application Priority Data

Sep. 22, 2020 (CN) .......................... 202011002096.7

(51) Int. Cl.
*H01L 27/32* (2006.01)
*H10K 59/123* (2023.01)
(Continued)

(52) U.S. Cl.
CPC ......... *H10K 59/123* (2023.02); *H10K 59/122* (2023.02); *H10K 59/124* (2023.02); *H10K 71/00* (2023.02); *H10K 59/1201* (2023.02)

(58) Field of Classification Search
CPC ............ H01L 27/3248; H01L 27/3246; H01L 27/3258; H01L 51/56; H01L 2227/323
(Continued)

(56) References Cited

U.S. PATENT DOCUMENTS

2012/0040478 A1\* 2/2012 Takeuchi ............ H01L 27/3246
                                                                   438/23
2013/0099221 A1\* 4/2013 Kawamura ......... H01L 51/0001
                                                                   438/34
(Continued)

FOREIGN PATENT DOCUMENTS

| CN | 108511492 A | 9/2018 |
| CN | 110993834 A | 4/2020 |
| KR | 2010-0058225 A | 6/2010 |

OTHER PUBLICATIONS

Office Action dated Apr. 2, 2022, in corresponding Chinese patent Application No. 202011002096.7, 14 pages.

*Primary Examiner* — Dzung Tran
(74) *Attorney, Agent, or Firm* — Xsensus LLP

(57) ABSTRACT

The present disclosure relates to the field of display technology, and proposes a display panel, a preparation method thereof, and a display apparatus. The display panel includes an array substrate, a planarization layer group, and a plurality of sub-pixels. The array substrate includes a switch array formed by a plurality of switch units. The planarization layer group is provided on the array substrate, and nanoscale grooves are provided on the planarization layer group. The sub-pixels are provided on a side of the planarization layer group away from the array substrate. The sub-pixel includes a plurality of first electrodes, wherein the first electrode is connected to the switch unit of the array substrate, a nano-scale second gap is provided between two adjacent first electrodes, and an orthographic projection of
(Continued)

the second gap on the array substrate is located within an orthographic projection of the groove on the array substrate.

14 Claims, 8 Drawing Sheets

(51) Int. Cl.
    *H10K 59/122*     (2023.01)
    *H10K 59/124*     (2023.01)
    *H10K 71/00*     (2023.01)
    *H10K 59/12*     (2023.01)

(58) Field of Classification Search
    USPC .......................................................... 257/40
    See application file for complete search history.

(56) References Cited

U.S. PATENT DOCUMENTS

| | | | |
|---|---|---|---|
| 2014/0354139 A1* | 12/2014 | Yoon | H01L 51/0005 |
| | | | 445/24 |
| 2015/0001514 A1* | 1/2015 | Goto | H01L 27/3246 |
| | | | 438/35 |
| 2017/0213878 A1* | 7/2017 | Song | H01L 27/3262 |
| 2018/0350888 A1* | 12/2018 | Huo | H01L 27/3246 |
| 2019/0355799 A1* | 11/2019 | Jeong | H01L 27/3262 |

\* cited by examiner

DISPLAY PANEL, PREPARATION METHOD THEREOF, AND DISPLAY APPARATUS

CROSS-REFERENCE TO RELATED APPLICATION

This application claims the benefit of and priority to Chinese Patent Application No. 202011002096.7, filed on Sep. 22, 2020, the contents of which being incorporated by reference in their entirety herein.

TECHNICAL FIELD

The present disclosure relates to the field of display technology and, in particular to a display panel, a method for preparing the display panel, and a display apparatus including the display panel.

BACKGROUND

Display of traditional organic light-emitting diodes (OLEDs) is limited to two-dimensional (2D) display. With the advancement of semiconductor technology and processing, image processing technology is advancing rapidly. Current image processing hardware has achieved characteristics of miniaturization, high efficiency, and low heat generation. Three-dimensional (3D) display technology is gradually being put on the agenda. In addition, various optical solutions of 3D display are changing quickly, which lays the foundation for popularization of 3D display technology.

At present, 3D display technology and products are still concentrated in liquid crystal display (LCD) devices, and 3D display technology based in OLEDs is relatively rare. There are some studies that have realized the 3D display of the OLEDs, but it causes serious Mura abnormality and a short-circuit of the cathode.

The above-mentioned information disclosed in the background section is only used to strengthen the understanding of the background of the present disclosure, and therefore it may include information that does not constitute the prior art known to those of ordinary skill in the art.

SUMMARY

The purpose of the present disclosure is to overcome the above-mentioned shortcomings of severe Mura abnormality and short-circuit of the cathode in the related art. The present disclosure provides a display panel, a method for preparing the display panel, and a display apparatus including the display panel that does not produce Mura abnormality and short-circuit of the cathode.

The additional aspects and advantages of the present disclosure will be partly set forth in the following description, and partly will become apparent from the description, or may be learned through the practice of the present disclosure.

According to an aspect of the present disclosure, there is provided a display panel, including:

an array substrate, including a switch array formed by a plurality of switch units;

a planarization layer group, provided on the array substrate, wherein a plurality of nano-scale grooves are provided on the planarization layer group; and a plurality of sub-pixels, provided on a side of the planarization layer group away from the array substrate, wherein the sub-pixel includes:

a plurality of first electrodes, wherein the first electrode is connected to the switch unit of the array substrate, a nano-scale second gap is provided between two adjacent first electrodes, and an orthographic projection of the second gap on the array substrate is located within an orthographic projection of the groove on the array substrate.

In an exemplary embodiment of the present disclosure, a width of an opening of the groove is smaller than a width of a bottom of the groove.

In an exemplary embodiment of the present disclosure, the planarization layer group includes:

a planarization layer, provided on the array substrate, wherein a bottom groove is provided on the planarization layer; and a second passivation layer, provided on a side of the planarization layer away from the array substrate, wherein a nano-scale first gap communicating with the bottom groove is provided on the second passivation layer, and an orthographic projection of the first gap on the array substrate is located within an orthographic projection of the bottom groove on the array substrate.

In an exemplary embodiment of the present disclosure, a width of the first gap is greater than or equal to 10 nanometers and less than or equal to 50 nanometers; a width of the bottom groove is greater than or equal to 50 nanometers and less than or equal to 100 nanometers, a depth of the bottom groove is greater than or equal to 150 nanometers.

In an exemplary embodiment of the present disclosure, the planarization layer group includes:

a planarization layer made of negative photoresist, wherein the groove is provided on the planarization layer, and a cross-sectional shape of the groove perpendicular to an extending direction of the second gap is a trapezoid having a bottom width greater than an opening width.

In an exemplary embodiment of the present disclosure, the sub-pixel further includes:

a pixel defining layer, provided on a side of the plurality of first electrodes away from the array substrate, a part of the pixel defining layer is filled into the second gap and at least a part of the groove to form an isolation plug.

In an exemplary embodiment of the present disclosure, a second via hole is provided on the pixel defining layer to expose the plurality of first electrodes, and the sub-pixel further includes:

a light-emitting layer, provided in the second via hole of the pixel defining layer and connected to the plurality of first electrodes;

a second electrode, provided on a side of the light-emitting layer away from the array substrate.

In an exemplary embodiment of the present disclosure, the array substrate includes:

a base substrate;

a buffer layer, provided on the base substrate;

an active layer, provided on a side of the buffer layer away from the base substrate;

a gate insulating layer, provided on a side of the active layer away from the base substrate;

a gate electrode, provided on a side of the gate insulating layer away from the base substrate;

an interlayer dielectric layer, provided on a side of the gate electrode away from the base substrate, wherein a third via hole is provided on the gate insulating layer, and a fourth via hole communicating with the third via hole is provided on the interlayer dielectric layer to expose a part of the active layer;

a first source electrode and a first drain electrode, provided on a side of the interlayer dielectric layer away from the base substrate, wherein the first source electrode and the first drain electrode are connected to the active layer through the fourth via hole and the third via hole.

In an exemplary embodiment of the present disclosure, the array substrate further includes:

a first passivation layer, provided on a side of the first source electrode and the first drain electrode away from the base substrate, wherein a fifth via hole is provided on the first passivation layer to expose the first source electrode and the first drain electrode;

a second source electrode and a second drain electrode, arranged on a side of the first passivation layer away from the base substrate, wherein the second source electrode and the second drain electrode are connected to the first source electrode and the first drain electrode through the fifth via hole.

According to an aspect of the present disclosure, there is provided a method for preparing a display panel, including:

providing an array substrate, wherein the array substrate includes a switch array formed by a plurality of switch units;

forming a planarization layer group on the array substrate, and forming a plurality of nano-scale grooves on the planarization layer group; and forming a plurality of sub-pixels on a side of the planarization layer group away from the array substrate, wherein the sub-pixel includes:

a plurality of first electrodes, wherein the first electrode is connected to the switch unit of the array substrate, a nano-scale second gap is provided between two adjacent first electrodes, and an orthographic projection of the second gap on the array substrate is located within an orthographic projection of the groove on the array substrate.

In an exemplary embodiment of the present disclosure, the sub-pixel further includes: a pixel defining layer, provided on a side of the plurality of first electrodes away from the array substrate, a part of the pixel defining layer is filled into the second gap and at least a part of the groove to form an isolation plug.

In an exemplary embodiment of the present disclosure, the forming a planarization layer group on the array substrate and forming a plurality of nano-scale grooves on the planarization layer group includes:

forming a planarization layer on the array substrate;

forming a second passivation layer on a side of the planarization layer away from the array substrate, and forming a nano-scale first gap on the second passivation layer through a nano-imprint process; and patterning the planarization layer by using the second passivation layer as a mask, and forming a bottom groove communicating with the first gap on the planarization layer, wherein an orthographic projection of the first gap on the array substrate is located within an orthographic projection of the bottom groove on the array substrate.

In an exemplary embodiment of the present disclosure, the forming a planarization layer group on the array substrate and forming a plurality of nano-scale grooves on the planarization layer group includes:

forming a planarization layer on the array substrate, wherein the planarization layer is made of negative photoresist;

performing a nano-imprint process on the planarization layer to form the groove on the planarization layer, wherein a cross-sectional shape of the groove perpendicular to an extending direction of the second gap is a trapezoid having a bottom width greater than an opening width.

According to an aspect of the present disclosure, there is provided a display apparatus, including any one of the display panels described above.

It can be seen from the above technical solutions that the present disclosure has at least one of the following advantages and positive effects.

In the display panel of the present disclosure, a planarization layer group is provided on the array substrate, and a plurality of nano-scale grooves are provided on the planarization layer group; and a plurality of first electrodes are provided on the side of the planarization layer group away from the base substrate. A nano-scale second gap is formed between two adjacent first electrodes, and the orthographic projection of the second gap on the base substrate is located in the orthographic projection of the groove on the base substrate. On the one hand, the nano-scale grooves are formed on the planarization layer group, such that a nano-scale second gap is formed between two adjacent first electrodes, to avoid the occurrence of Mura abnormality. On the other hand, the first electrode is arranged on the planarization layer group to avoid a stacking arrangement, so that the second electrode arranged on the first electrode undulates more smoothly and is not easy to be disconnected due to fracture. On another hand, compared with the related art, light-emitting layers arranged on the plurality of first electrodes are coplanar, so they can be completely set on the focal plane of the lens to improve the display effect. On still another hand, the plurality of first electrodes are formed by once patterning process, which reduces a process of manufacturing anodes compared with the related art, improves production efficiency, and saves manpower and material resources.

BRIEF DESCRIPTION OF THE DRAWINGS

The above-mentioned and other features and advantages of the present disclosure will become more apparent by describing the exemplary embodiments thereof in detail with reference to the accompanying drawings.

DETAILED DESCRIPTION

Figure 1:
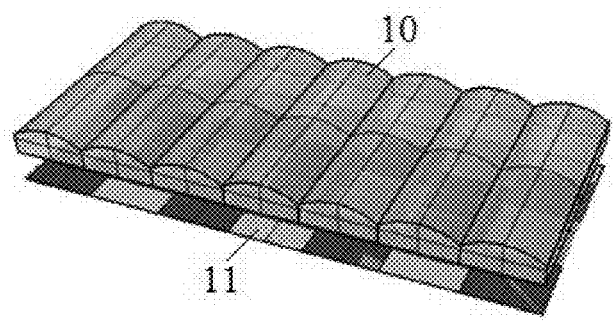
FIG. 1 is a schematic diagram of the structure of an OLED 3D display panel.

Example embodiments will now be described more fully with reference to the accompanying drawings. However, the example embodiments can be implemented in various forms, and should not be construed as being limited to the embodiments set forth herein; on the contrary, these embodiments are provided so that the present disclosure will be comprehensive and complete, and fully convey the concept of the example embodiments to those skilled in the art. The same reference numerals in the figures indicate the same or similar structures, and thus their detailed descriptions will be omitted.

The reference signs of the main components in the figures are explained as follows: 1. base substrate; 2. array substrate; 21. buffer layer; 22. active layer; 23. gate insulating layer; 24. gate electrode; 25. interlayer dielectric layer; 26. first source electrode; 27. first drain electrode; 28. first passivation layer; 29. second source electrode; 30. second drain electrode; 3. planarization layer group; 31. planarization layer; 32. second passivation layer; 4. groove; 41. first gap; 42. bottom groove; 5. secondary sub-pixel; 51. first electrode; 511. second gap; 52. pixel defining layer; 521. isolation plug; 53. light-emitting layer; 54. second electrode; 6. encapsulation layer; 71. first via hole; 72. the second via hole; 73. third via hole; 74. fourth via hole; 75. fifth via hole; 81. red sub-pixel; 82. red secondary sub-pixel; 83. green sub-pixel; 84. green secondary sub-pixel; 85. blue sub-pixel; 86. blue secondary sub-pixel; 9. eye; 10. lens; 11. display panel; 12. anode; 13. cathode; and 14. first electrode material layer.

Figure 2:
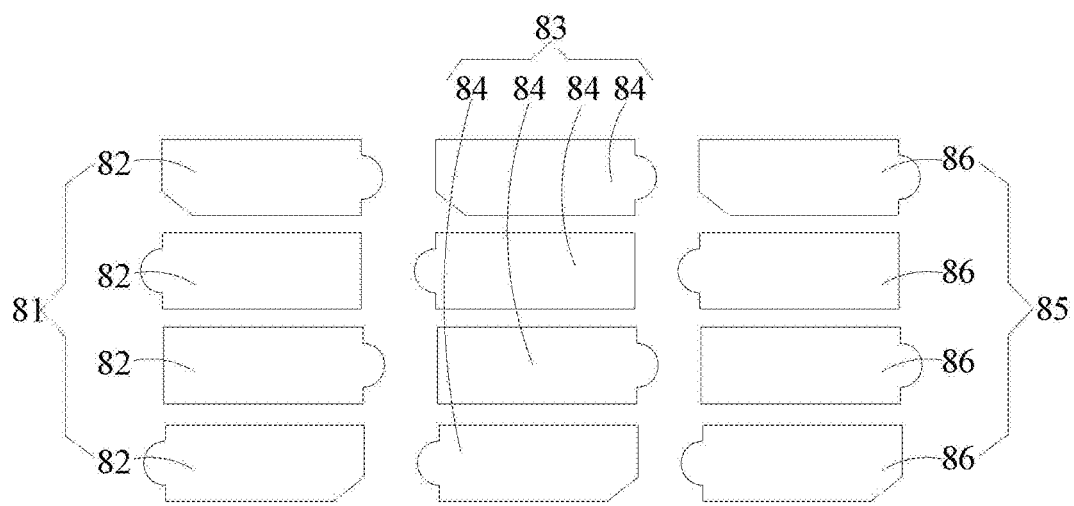
FIG. 2 is a schematic diagram of a divided structure of the sub-pixels in FIG. 1.
Figure 3:
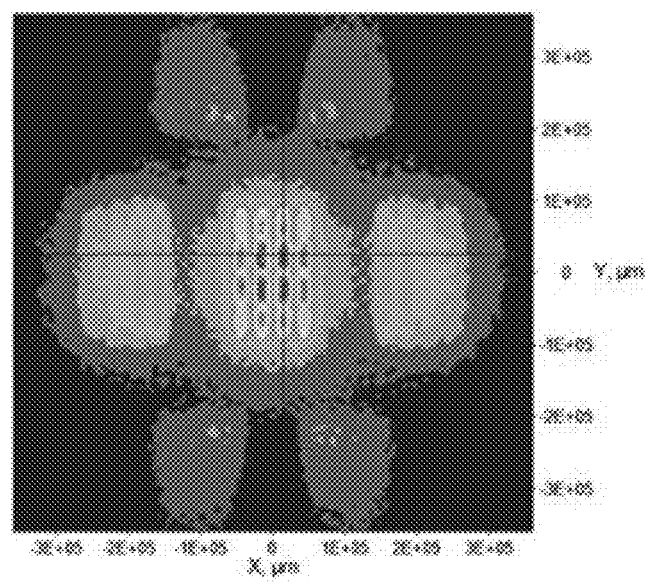
FIG. 3 is a display effect diagram of the display panel in FIG. 1 producing Mura defects.
Figure 4:
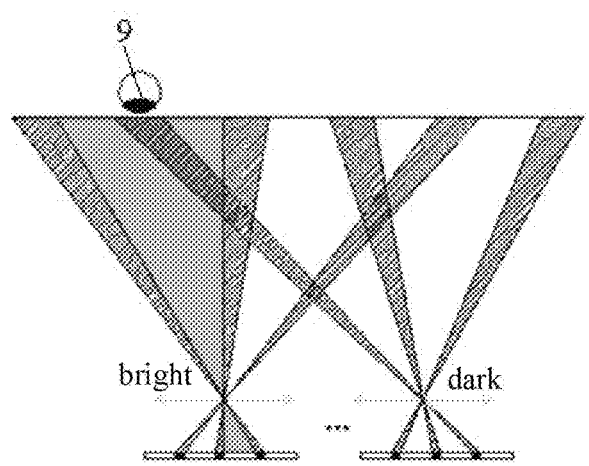
FIG. 4 is a principle schematic diagram of the display panel in FIG. 1 producing Mura defects.
Figure 5:
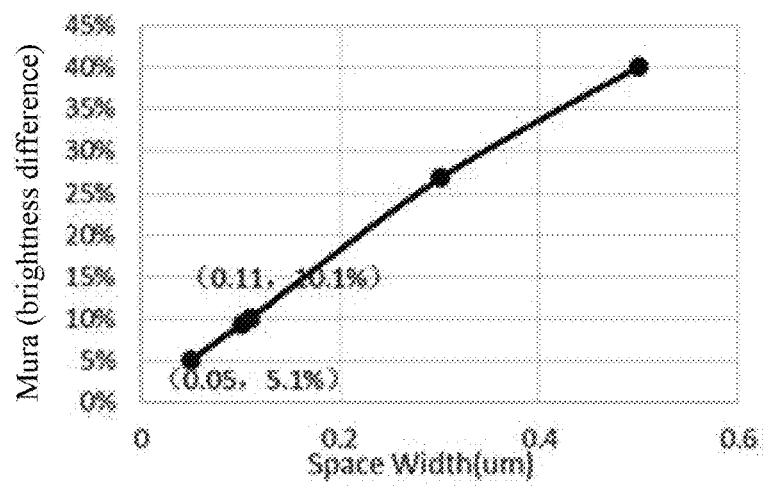
FIG. 5 is a corresponding diagram of the width of the anode gap and the degree of Mura defects.

Referring to FIGS. 1 and 2, in the related art, a method for implementing 3D display of the OLED display panel 11 is to divide one sub-pixel into a plurality of secondary sub-pixels. For example, as shown in FIG. 2, the red sub-pixel 81 is divided to form four secondary sub-pixels, the green sub-pixel 83 is divided to form four green secondary sub-pixels 84, the blue sub-pixel 85 is divided to form four blue secondary sub-pixels 86, and the light-emitting layer of the sub-pixels of the display panel 11 is placed on a focal plane of the lens 10. However, limited to the technological level of the display panel 11, the gap between the secondary sub-pixels in each sub-pixel can only be realized at the micron level, which results in severe Mura abnormality, as shown in FIG. 3, when an OLED implements 3D display. Referring to FIG. 4, the principle of generating the Mura abnormality includes when the secondary sub-pixels emit light discontinuously, the gap between the secondary sub-pixels in each sub-pixel does not emit light, which causes that the lens area viewed by the eye 9 to be bright or dark, and all the bright areas and dark areas will be connected together to form 3D Mura. The corresponding graph of the width of the anode gap and the degree of Mura defects shown in FIG. 5 is obtained by simulation. It can be seen that when the gap between secondary sub-pixels is less than 0.05 um, the degree of Mura defects can be controlled within 5%, which is in an acceptable range. The gap between the secondary sub-pixels is determined by the gap between the anodes.

Figure 6:
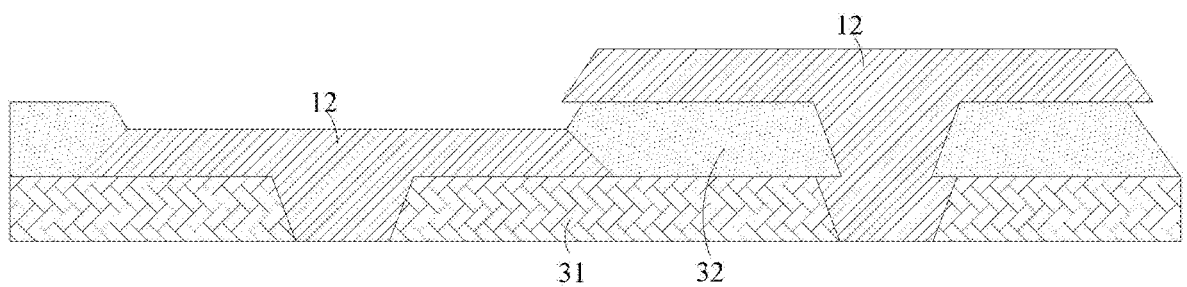
FIG. 6 is a schematic diagram of the arrangement structure of anodes in the related art.
Figure 7:
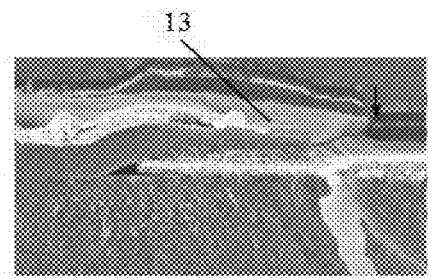
FIG. 7 is a schematic diagram of the fractured microstructure of the cathode in the related art.

In addition, FIG. 6 shows the schematic diagram of the arrangement structure of anodes in the related art. It can be seen from the figure that the secondary sub-pixels are in a laminated structure. That is, the anodes 12 of two adjacent secondary sub-pixels are arranged in different layers. In the two adjacent anodes, one anode 12 is directly arranged on the planarization layer 31, and a second passivation layer 32 is arranged between the other anode 12 and the planarization layer 31. The laminated structure of the secondary sub-pixel finally leads to cathode 13 arranged on the anode 12 shown in FIG. 7 disconnected due to fracture. The position indicated by the arrow in the figure is the fracture.

Figure 8:
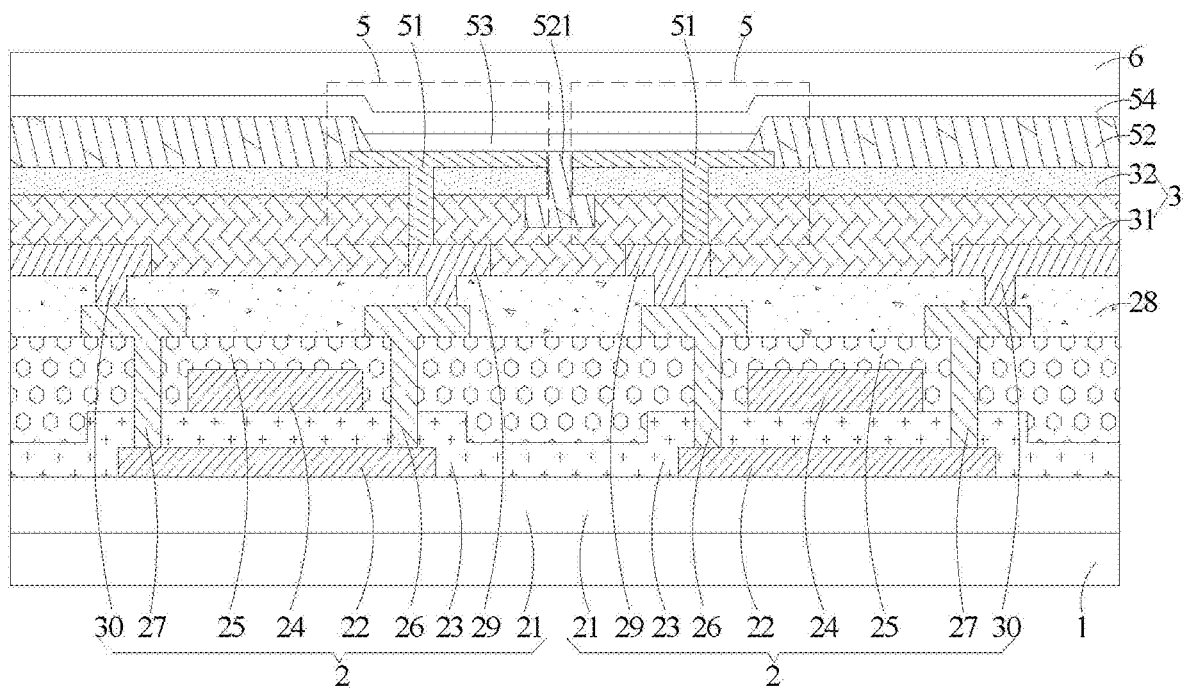
FIG. 8 is a schematic structural diagram of a display panel of an exemplary embodiment of the present disclosure.

This example embodiment first provides a display panel. As shown in FIG. 8, the display panel may include a base substrate 1, an array substrate 2, a planarization layer group 3, and a plurality of sub-pixels. The array substrate 2 is provided on the base substrate 1. The planarization layer group 3 is provided on a side of the array substrate 2 away from the base substrate 1, and the side of the planarization layer group 3 away from the base substrate 1 is flat. The planarization layer group 3 is provided with a plurality of nano-scale grooves 4 and a plurality of first via holes 71. A plurality of sub-pixels are provided on a side of the planarization layer group 3 away from the array substrate 2. The sub-pixel includes a pixel defining layer 52, a light-emitting layer 53, a second electrode 54, and a plurality of first electrodes 51. The plurality of first electrodes 51 are provided on the side of the planarization layer group 3 away from the base substrate 1. The first electrode 51 is connected to the array substrate 2 through the first via hole 71. That is, the first electrode is connected to the switch unit of array substrate 2. A nano-scale second gap 511 is arranged between two adjacent first electrodes 51. An orthographic projection of the second gap 511 on the base substrate 1 is located within an orthographic projection of the groove 4 on the base substrate 1. The pixel defining layer 52 is provided on a side of the plurality of first electrodes 51 away from the base substrate 1, and a part of the pixel defining layer is filled into the second gap 511 and at least a part of the groove 4 to form an isolation plug 521 to isolate the adjacent first electrodes 51 from each other. A second via hole 72 is provided on the pixel defining layer 52 to expose a plurality of the first electrodes 51. The light emitting layer 53 is provided within the second via hole 72 of the pixel defining layer 52 and is connected to the first electrode 51. The second electrode 54 is provided on the side of the light-emitting layer 53 away from the base substrate 1.

Figure 9:
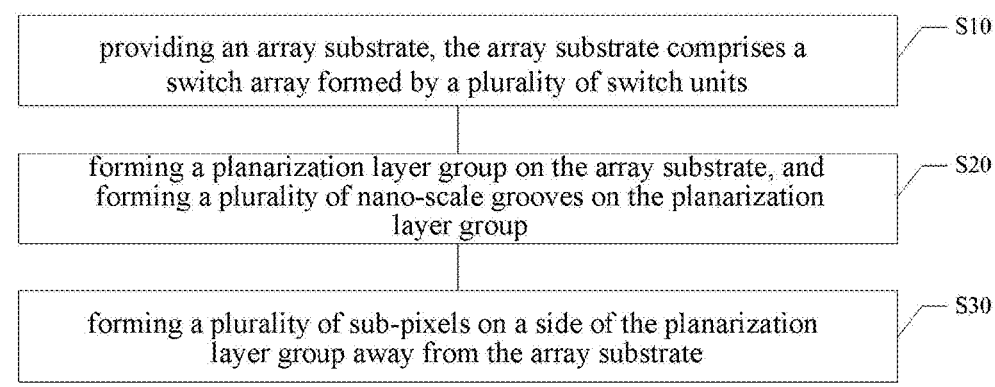
FIG. 9 is a schematic block diagram of a process flow of a method for preparing a display panel of an exemplary embodiment of the present disclosure.

Further, this example embodiment also provides a method for preparing a display panel. FIG. 9 shows the schematic block diagram of the flowchart of an example embodiment of the method for preparing a display panel of the present disclosure. The method for preparing the display panel may include following steps:

step S10, providing an array substrate, wherein the array substrate includes a switch array formed by a plurality of switch units;

step S20, forming a planarization layer group on the array substrate, and forming a plurality of nano-scale grooves on the planarization layer group; and step S30, forming a plurality of sub-pixels on a side of the planarization layer group away from the array substrate.

In the embodiment, the sub-pixel includes a pixel defining layer 52 and a plurality of first electrodes. The first electrode is connected to the switch unit of the array substrate. A nano-scale second gap is formed between two adjacent first electrodes. An orthographic projection of the second gap on the array substrate is located within an orthographic projection of the groove on the array substrate. The pixel defining layer 52 is provided on a side of the plurality of first electrodes away from the array substrate. A part of the pixel defining layer 52 is filled into the second gap and at least part of the groove to form an isolation plug.

Hereinafter, the above steps and the specific structure of the display panel will be described in detail.

In step S10, an array substrate is provided. The array substrate includes a switch array formed by a plurality of switch units.

In this exemplary embodiment, the array substrate 2 is a top-gate thin-film transistor (TFT) array substrate 2. The preparation method is as follows.

Figure 10:
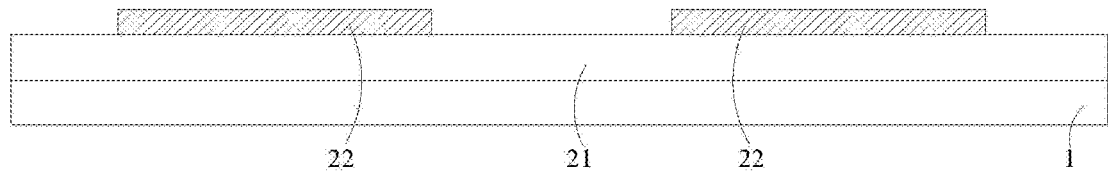
FIGS. 10-20 are structural schematic diagrams of various steps of the preparing method of the display panel of the present disclosure.

Referring to FIG. 10, a base substrate 1 is provided. In this exemplary embodiment, the base substrate 1 is a glass substrate. It may also be a flexible substrate, for example, polyimide resin.

A buffer layer 21 is deposited and formed on the base substrate 1, and the material of the buffer layer 21 may be silicon nitride or silicon oxynitride, or a laminated structure formed by silicon nitride and silicon oxynitride. An active material layer is deposited and formed on a side of the buffer layer 21 away from the base substrate 1, and the active material layer is photo-etched to form an active layer 22. The material of the active material layer may be a polysilicon (p-Si) or oxide (Indium Gallium Zinc Oxide) film layer.

Figure 11:
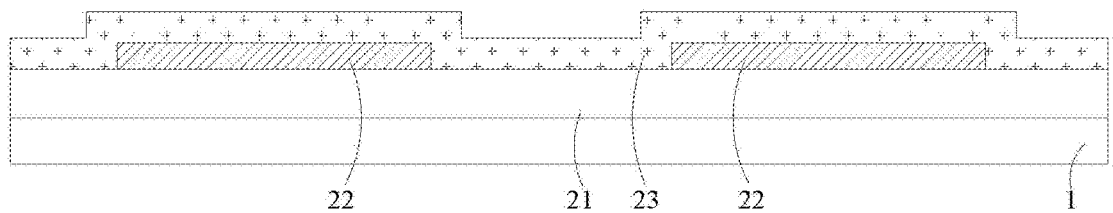

Referring to FIG. 11, a gate insulating layer 23 is deposited and formed on a side of the active layer 22 and the buffer layer 21 away from the base substrate 1. The material of the gate insulating layer 23 can be silicon oxide, silicon nitride or silicon oxynitride. It may also be a laminated structure formed by two or three of silicon oxide, silicon nitride, and silicon oxynitride.

Figure 12:
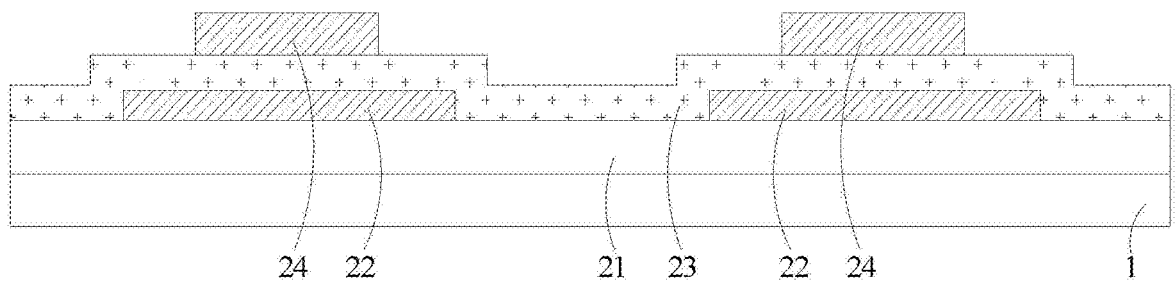

Referring to FIG. 12, a gate material layer is deposited and formed on a side of the gate insulating layer 23 away from the base substrate 1, and the gate material layer is dry-etched or wet-etched to form a gate electrode 24. The material of the gate material layer can be Mo, Ti, AL, or the like. It can also be other metals having good conductivity.

Figure 13:
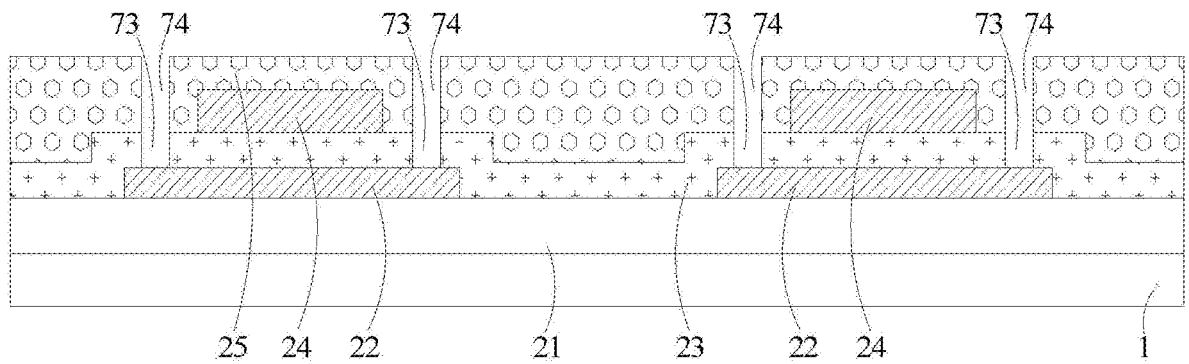

Referring to FIG. 13, an interlayer dielectric layer 25 is deposited and formed on a side of the gate electrode 24 and the gate insulating layer 23 away from the base substrate 1. The material of the interlayer dielectric layer 25 can be silicon oxide, silicon nitride or silicon oxynitride, and it may also be a laminated structure formed by two or three of silicon oxide, silicon nitride, and silicon oxynitride. Dry etching is performed on the interlayer dielectric layer 25 and the gate insulating layer 23, so that a fourth via hole 74 is formed on the interlayer dielectric layer 25, and a third via hole 73 is formed on the gate insulating layer 23. The third via hole 73 and the fourth via hole 74 are connected to the active layer 22 so that a part of the active layer 22 is exposed.

Figure 14:
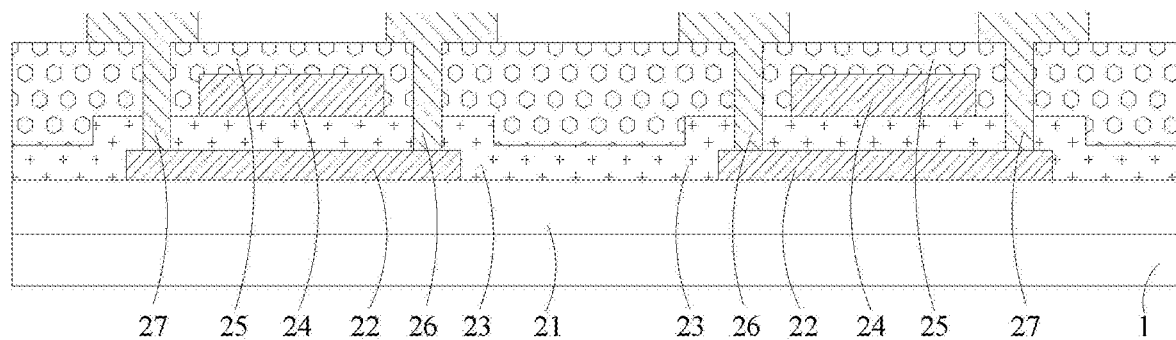

Referring to FIG. 14, a first source-drain material layer is deposited and formed on a side of the interlayer dielectric layer 25 away from the base substrate 1. The material of the first source-drain material layer can be Mo, Ti, AL, or the like. It can also be other metals with good conductivity. Dry etching is performed on the first source-drain material layer, so that the first source-drain material layer forms a first source electrode 26 and a first drain electrode 27, and the first source electrode 26 and the first drain electrode 27 are respectively connected to the active layer 22.

Figure 15:
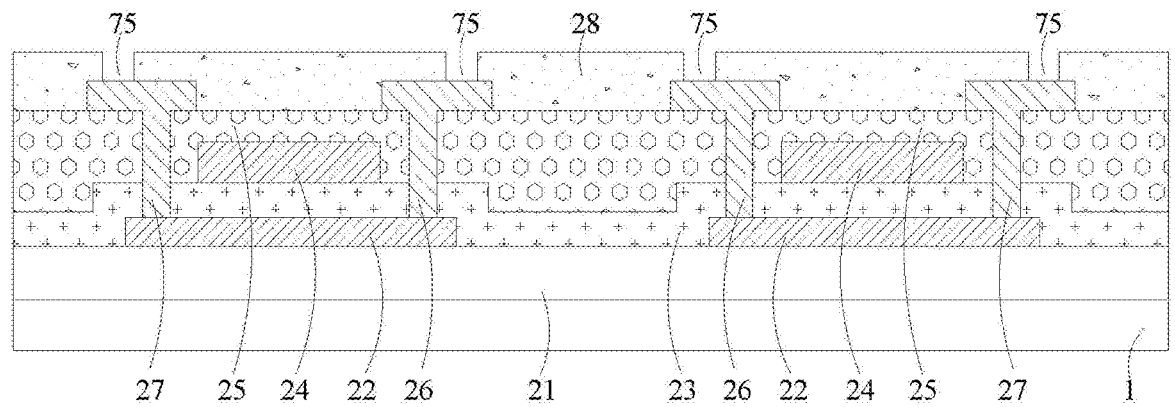

Referring to FIG. 15, a first passivation layer 28 is deposited and formed on a side of the first source electrode 26, the first drain electrode 27 and the interlayer dielectric layer 25 away from the base substrate 1. The material of the first passivation layer 28 can be silicon oxide, silicon nitride or silicon oxynitride, or a laminated structure formed by two or three of silicon oxide, silicon nitride and silicon oxynitride. A fifth via hole 75 is formed on the first passivation layer 28 by dry etching, and the fifth via hole 75 is connected to the first source electrode 26 and the first drain electrode 27.

Figure 16:
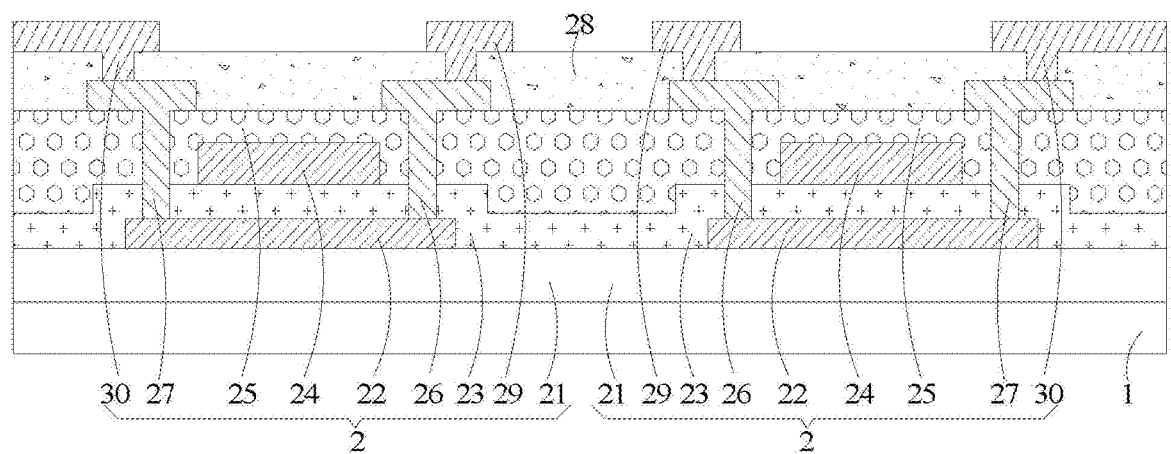

Referring to FIG. 16, a second source-drain material layer is deposited and formed on a side of the first passivation layer 28 away from the base substrate 1. The material of the second source-drain material layer can be Mo, Ti, AL, or the like. It can also be other metals with good conductivity. Dry etching is performed on the second source-drain material layer, so that the second source-drain material layer forms a second source electrode 29 and a second drain electrode 30, and the second source electrode 29 and the second drain electrode 30 are respectively connected to the first source electrode 26 and first drain electrode 27. The second source electrode 29 and the second drain electrode 30 are used as the connecting lead of the first source electrode 26 and the first drain electrode 27, which facilitates the subsequent design of the first electrode 51 and each sub-pixel, so that the design of each sub-pixel does not have to be affected by positions of the first source electrode 26 and the first drain electrode 27, and can be arranged at appropriate positions as required.

So far, the preparation of the array substrate 2 is completed. In other exemplary embodiments of the present disclosure, the array substrate 2 may also be a bottom-gate type TFT array substrate or a double-gate type TFT array substrate, etc., which will not be described one by one herein. Moreover, the first passivation layer 28 may not be provided, and the second source electrode 29 and the second drain electrode 30 may not be provided. That is, the first electrode 51 generated subsequently is directly connected to the first source electrode 26 and the first drain electrode 27.

One gate electrode 24, one active layer 22, one first source electrode 26 and one first drain electrode 27 form one thin film transistor, i.e., one switch unit, and a plurality of switch units control one secondary sub-pixel 5. The plurality of switch units of the plurality of secondary sub-pixels 5 form a switch array.

Step S20, a planarization layer group is formed on the array substrate, and a plurality of nano-scale grooves are formed on the planarization layer group.

In this example embodiment, a width of an opening of the groove is smaller than a width of a bottom of the groove. The extending direction of the groove is the length direction of the groove, and the width direction is a direction substantially perpendicular to the length direction. Moreover, the width mentioned in this specification is consistent with the width direction of the groove.

Figure 17:
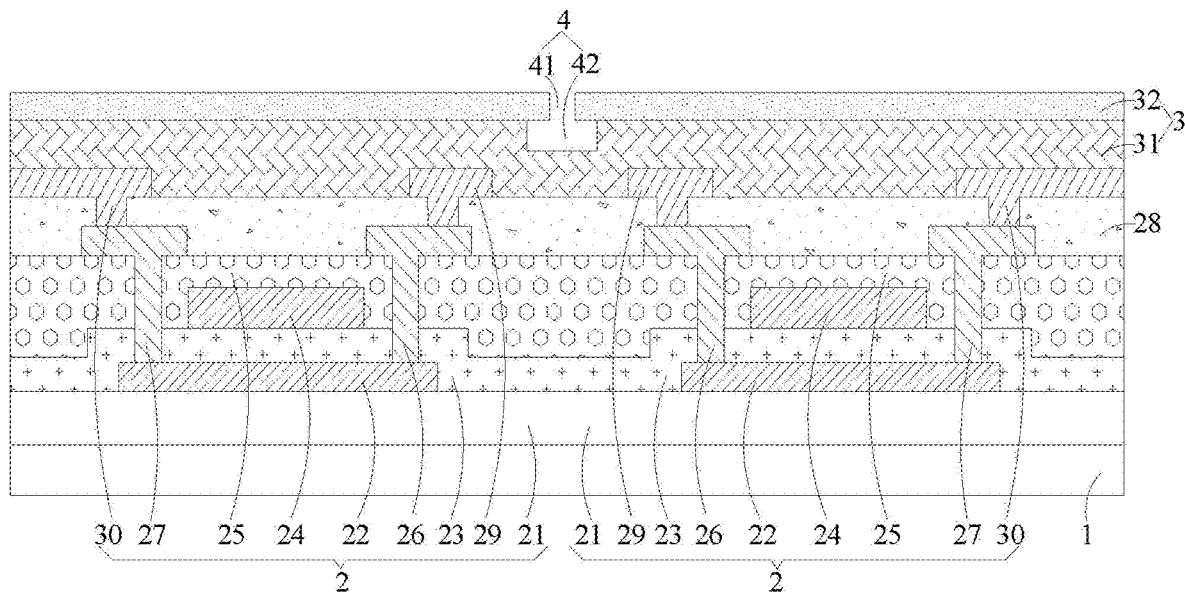

Referring to FIG. 17, the side of the second source electrode 29, the second drain electrode 30 and the first passivation layer 28 away from the base substrate 1 is coated to form a planarization layer 31. The material of the planarization layer 31 may be resin. A second passivation layer 32 is deposited and formed on a side of the planarization layer 31 away from the base substrate 1. The material of the second passivation layer 32 can be silicon oxide, silicon nitride or silicon oxynitride, or a laminated structure formed by two or three of silicon oxide, silicon nitride and silicon oxynitride.

A nano-scale first gap 41 is formed on the second passivation layer 32 through a nano-imprint process. Specifically, a side of the second passivation layer 32 away from the base substrate 1 is coated and formed with photoresist, and the photoresist is imprinted with an imprint template, so that the photoresist at the position where the first gap 41 needs to be formed is imprinted thinly. Then ultraviolet light is used to cure the photoresist to remove the imprint template. Then an etching solution is used to etch away the photoresist that was not completely removed in the previous step, exposing the surface of the second passivation layer 32 where the first gap 41 needs to be formed. Then a chemical etching method is used to form a nano-scale first gap 41 on the second passivation layer 32, and then all the photoresist is removed after the process completes. Finally, a high-precision nano-scale first gap 41 is obtained.

Figure 21:
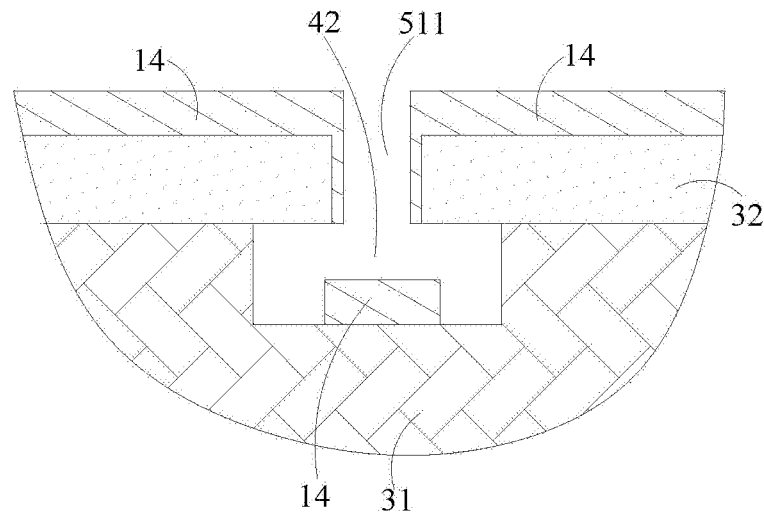
FIG. 21 is a partial enlarged schematic diagram of the structure after forming the first electrode material layer in the previous step of FIG. 19.

Then, the planarization layer 31 is etched by using the second passivation layer 32 as a mask. The etching process may be dry etching, so that a bottom groove 42 is formed on the planarization layer 31. The first gap 41 and the bottom groove 42 communicate with each other to form the groove 4. In this exemplary embodiment, the bottom groove 42 does not penetrate through the planarization layer 31, and the orthographic projection of the first gap 41 on the base substrate 1 is located in the orthographic projection of the bottom groove 42 on the base substrate 1. That is, the width of the first gap 41 is smaller than the width of the bottom groove 42. Referring to FIG. 21, when the first electrode material layer 14 is deposited subsequently, the first electrode material layer 14 can only be deposited on a part of the bottom of the bottom groove 42 and the sidewall of the first gap 41, and cannot be deposited on the top and the sidewall of bottom groove 42, such that the first electrode material layer 14 cannot be connected to form the second gap 511 at the groove.

In this example embodiment, the width of the first gap 41 is greater than or equal to 10 nanometers and less than or equal to 50 nanometers; the width of the bottom groove 42 is greater than or equal to 50 nanometers and less than or equal to 100 nanometers, and the depth of the bottom groove 42 is greater than or equal to 150 nanometers.

Figure 22:
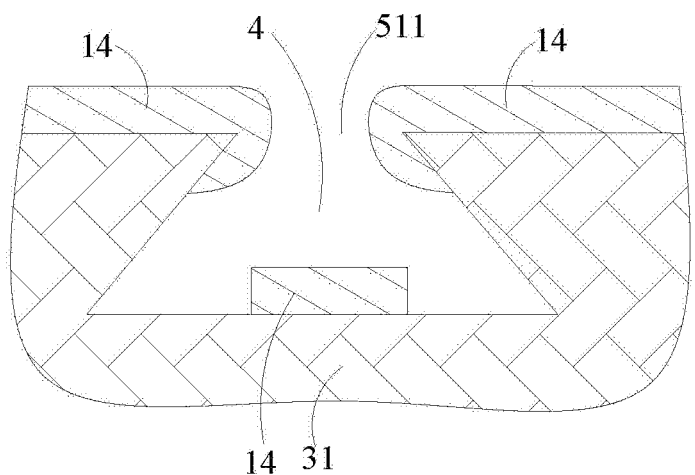
FIG. 22 is a partially enlarged schematic diagram of another exemplary embodiment of the display panel of the present disclosure after the first electrode material layer is formed.

In other exemplary embodiments of the present disclosure, referring to FIG. 22, the planarization layer group 3 may include only one planarization layer 31. The material of the planarization layer 31 is negative photoresist. The nano-imprint process is performed on the planarization layer 3, to form the groove 4 on the planarization layer. A cross-sectional shape of the groove 4 perpendicular to an extending direction of the second gap 511 is a trapezoid having a bottom width greater than an opening width. When the first electrode material layer 14 is deposited subsequently, the first electrode material layer 14 can only be deposited at a part of the bottom of the groove 4 and the opening of the groove 4, and cannot be deposited on the sidewall of the groove 4 near the bottom, which causes that the first electrode material layer 14 cannot be connected to form a second gap 511 at the groove 4.

In addition, the first gap 41 and the bottom groove 42 communicate with each other to form a deep groove 4, and the depth is about 150 nm. At this time, the orthographic projection of the first gap 41 on the base substrate 1 and the orthographic projection of the bottom groove 42 on the base substrate 1 may coincide, that is, the width of the first gap 41 is equal to the width of the bottom groove 42. When the first gap 41 and the bottom groove 42 communicate with each other to form the groove 4 with a depth deep enough, the width of the side of the bottom groove 42 close to the base substrate 1 may be narrower than the first gap 41.

Figure 18:
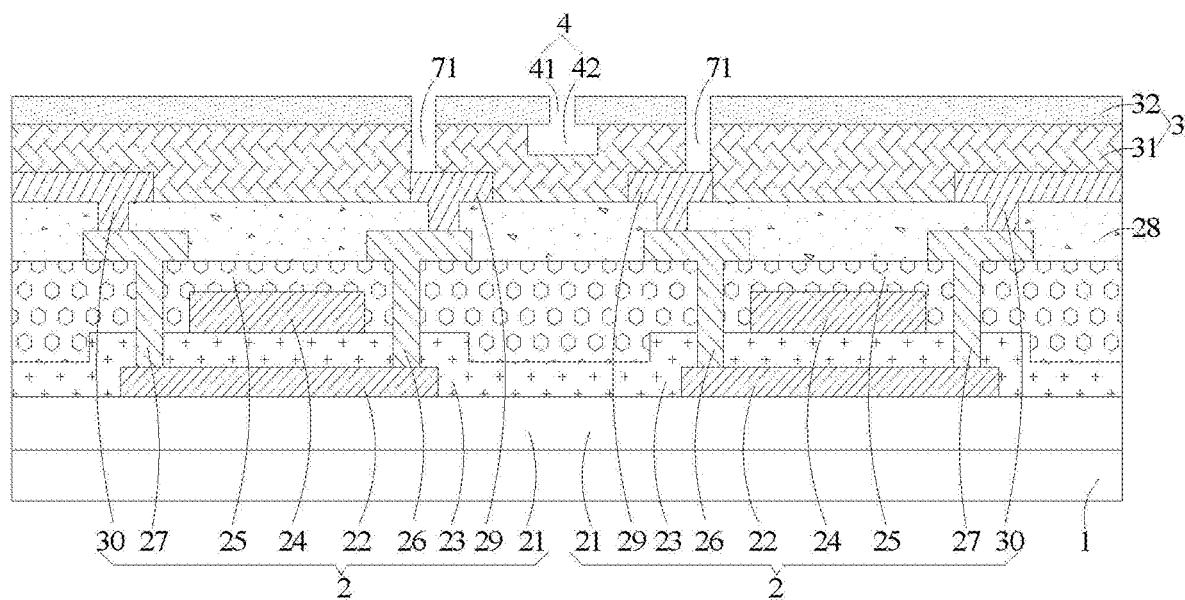

Referring to FIG. 18, the second passivation layer 32 and the planarization layer 31 are etched to form a first via hole 71. The first via hole 71 is micron-scale.

So far, the preparation of the planarization layer group 3 is completed. In other exemplary embodiments of the present disclosure, the planarization layer group 3 may further include more layers. For example, another interlayer dielectric layer may also be provided. It is also possible to provide only one second passivation layer 32 to make the thickness of the second passivation layer 32 thick, so that a deep first gap 41 can be formed on the second passivation layer 32. The depth of the first gap 41 is sufficient deep to form a nano-scale second gap 511 at the first gap 41 when the first electrode material layer is formed by deposition subsequently.

Step S30, a plurality of sub-pixels are formed on a side of the planarization layer group away from the array substrate.

In this exemplary embodiment, an example is described by dividing one sub-pixel to form two secondary sub-pixels 5. In other exemplary embodiments of the present disclosure, one sub-pixel may be divided to form three, four or more secondary sub-pixels 5.

Figure 19:
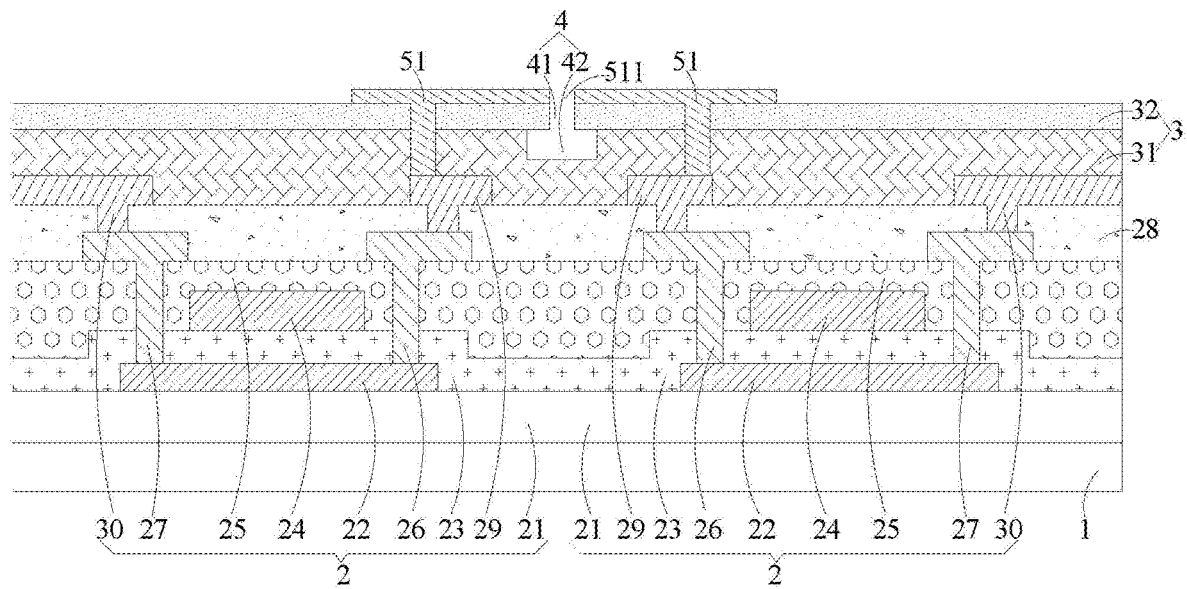

Referring to FIG. 19, a first electrode material layer is deposited and formed on the side of the second passivation layer 32 away from the base substrate 1. The material of the first electrode material layer can be ITO (Indium Tin Oxide) or a laminated structure formed by ITO/Ag/ITO. During the deposition of the first electrode material layer, due to the existence of the nano-scale groove 4, the first electrode material layer cannot be deposited at the groove 4, causing the first electrode material layer to form nano-scale fractures, that is, forming the nano-scale second gap 511. Then the first electrode material layer is etched to form a plurality of first electrodes 51. The first electrode 51 is connected to the second source electrode 29 through the first via hole 71. In other exemplary embodiments of the present disclosure, the first electrode 51 may also be connected to the second drain electrode 30 through the first via hole 71.

Figure 20:
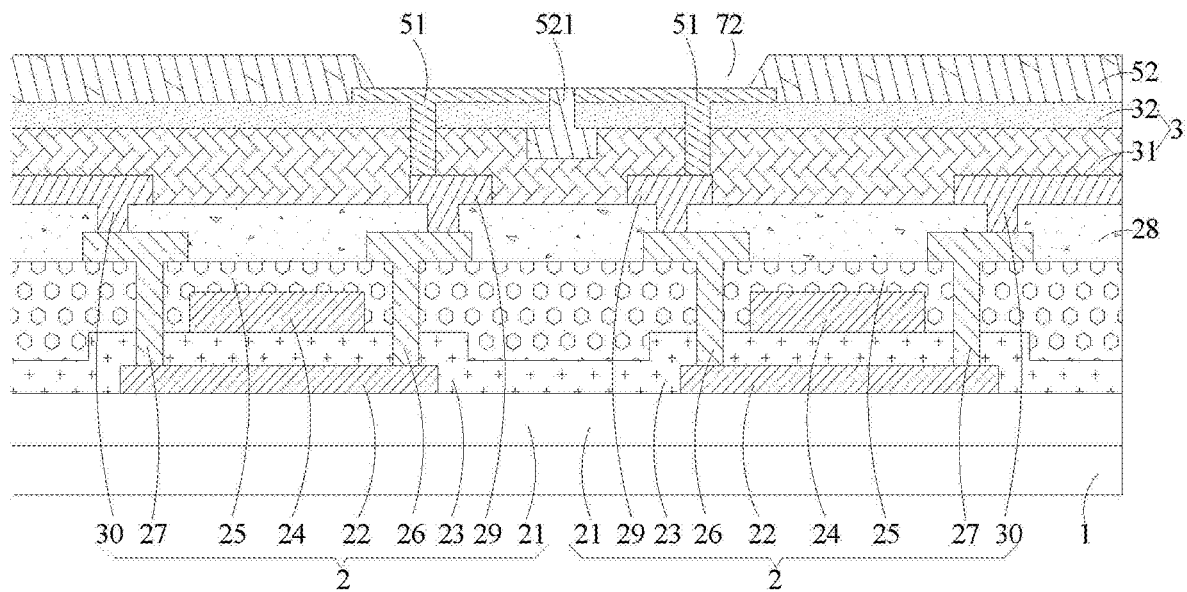

Referring to FIG. 20, a material layer of the pixel defining layer 52 is formed on the side of the plurality of first electrodes 51 and the second passivation layer 32 away from the base substrate 1. In this process, since the material of the pixel defining layer 52 is fluid-shaped, it will flow into the second gap 511 between the first electrodes 51, and flow into at least part of the first gap 41 and at least a part of the bottom groove 42 on the second passivation layer 32 to form an isolation plug 521. The isolation plug 521 is also nano-scale. The isolation plug 521 isolates two adjacent first electrodes 51 from each other, and further ensures that there is no connection between two adjacent first electrodes 51. Then, the material layer of the pixel defining layer 52 is etched to form a second via hole 72. The second via hole 72 exposes the plurality of first electrodes 51, that is, one second via hole 72 exposes the plurality of first electrodes 51.

Referring to FIG. 8, a light emitting layer 53 is formed in the second via hole 72 of the pixel defining layer 52. A second electrode 54 is formed on the side of the light emitting layer 53 and the pixel defining layer 52 away from the base substrate 1. An encapsulation layer 6 is formed on the side of the second electrode 54 away from the base substrate 1.

In this example embodiment, the first electrode 51 may be an anode, and the second electrode 54 may be a cathode.

In the display panel and the preparation method thereof of the present disclosure, the nano-scale groove 4 formed on the planarization layer group 3 makes a nano-scale second gap 511 formed between two adjacent first electrodes 51, and a part of the pixel defining layer 52 is filled in the second gap 511 to form an isolation plug 521, so that a nano-level isolation plug 521 is formed between the secondary sub-pixels 5 to avoid generating Mura abnormality. On one hand, the first electrode 51 is arranged on the planarization layer group 3 to avoid a stacking arrangement, so that the second electrode 54 arranged on the first electrode 51 undulates more smoothly and is not easy to be disconnected due to fracture. On the other hand, compared with the related art, light-emitting layers 53 arranged on the plurality of first electrodes 51 are coplanar, so they can be completely set on the focal plane of the lens 10 to improve the display effect. On still another hand, the plurality of first electrodes 51 are formed by once patterning process, which reduces a process of manufacturing the first electrodes 51 compared with the related art, improves production efficiency, and saves manpower and material resources.

Further, example embodiments also provide a display apparatus, which includes any one of the display panels described above. The specific structure of the display panel has been described in detail above, and therefore, it will not be repeated herein.

The specific type of the display apparatus is not particularly limited, and the types of display apparatuses commonly used in the field are all applicable, such as mobile apparatuses such as mobile phones, wearable devices such as watches, VR apparatuses, or the like. Those skilled in the art can make corresponding selection according to the specific purpose of the display apparatus, which will not be repeated herein.

It should be noted that, in addition to the display panel, the display apparatus also includes other necessary parts and components. Taking a display as an example, the display apparatus also includes a housing, a circuit board, a power line, or the like. Those skilled in the art can make corresponding supplement according to the specific usage requirements of the display apparatus, which will not be repeated herein.

Compared with the related art, the beneficial effects of the display apparatus provided by the exemplary embodiment of the present disclosure are the same as the beneficial effects of the display panel provided by the above-mentioned exemplary embodiments, which will not be repeated herein.

The features, structures, or characteristics described above can be combined in one or more embodiments in any suitable manner. If possible, the features discussed in the embodiments are interchangeable. In the above description, many specific details are provided to give a sufficient understanding of the embodiments of the present disclosure. However, those skilled in the art will realize that the technical solutions of the present disclosure can be practiced without one or more of the specific details, or other methods, components, materials, etc. can be used. In other cases, well-known structures, materials, or operations are not shown or described in detail to avoid obscuring aspects of the present disclosure.

Although relative terms such as "upper" and "lower" are used in this specification to describe the relative relationship between one component of an icon and another component of an icon, these terms are used in this specification only for convenience, for example, according to the direction of the example described in the drawings. It can be understood that if the apparatus of the icon is turned upside down, the component described as "upper" will become the "lower" component. Other relative terms, such as "high", "low", "top", and "bottom" have similar meanings. When a structure is "on" another structure, it may mean that a certain structure is integrally formed on another structure, or that a certain structure is "directly" arranged on another structure, or that a certain structure is "indirectly" installed on another structure through the other structure.

In this specification, the terms "a", "an", "the", "said", and "at least one" are used to indicate that there are one or more elements/components/etc. The terms "including", "including", and "having" is used to mean open-ended inclusion and means that in addition to the listed elements/components/etc., there may be additional elements/components/etc. The terms "first" and "second" and "third" are only used as markers, and are not a limitation on the number of objects.

It should be understood that the present disclosure does not limit its application to the detailed structure and arrangement of the components proposed in this specification. The present disclosure can have other embodiments, and can be implemented and executed in various ways. The aforementioned deformations and modifications fall within the scope of the present disclosure. It should be understood that the present disclosure disclosed and defined in this specification extends to all alternative combinations of two or more individual features mentioned or obvious in the text and/or drawings. All these different combinations constitute a plurality of alternative aspects of the disclosure. The embodiments described in this specification illustrate the best mode known for implementing the present disclosure, and will enable those skilled in the art to utilize the present disclosure.

What is claimed is:

1. A display panel, comprising:
an array substrate comprising a switch array formed by a plurality of switch units;
a planarization layer group provided on the array substrate, wherein a plurality of nano-scale grooves are provided on the planarization layer group; and
a plurality of sub-pixels provided on a side of the planarization layer group away from the array substrate;
wherein the sub-pixel comprises a plurality of first electrodes, wherein the first electrode is connected to the switch unit of the array substrate, a nano-scale second gap is provided between two adjacent first electrodes, and an orthographic projection of the second gap on the array substrate is located within an orthographic projection of the groove on the array substrate,
wherein the sub-pixel further comprises:
a pixel defining layer, provided on a side of the plurality of first electrodes away from the array substrate, a part of the pixel defining layer is filled into the second gap and at least a part of the groove to form an isolation plug, a second via hole is provided on the pixel defining layer to expose the plurality of first electrodes; and
a light-emitting layer provided in the second via hole of the pixel defining layer and connected to the plurality of first electrodes.

2. The display panel according to claim 1, wherein a width of an opening of the groove is smaller than a width of a bottom of the groove.

3. The display panel according to claim 2, wherein the planarization layer group comprises:
a planarization layer, provided on the array substrate, wherein a bottom groove is provided on the planarization layer; and
a second passivation layer, provided on a side of the planarization layer away from the array substrate, wherein a nano-scale first gap is provided on the second passivation layer, the first gap communicates with the bottom groove to form the groove, and an orthographic projection of the first gap on the array substrate is located within an orthographic projection of the bottom groove on the array substrate.

4. The display panel according to claim 3, wherein a width of the first gap is greater than or equal to 10 nanometers and less than or equal to 50 nanometers; a width of the bottom groove is greater than or equal to 50 nanometers and less than or equal to 100 nanometers, a depth of the bottom groove is greater than or equal to 150 nanometers.

5. The display panel according to claim 1, wherein the planarization layer group comprises: a planarization layer made of negative photoresist, wherein the groove is provided on the planarization layer, and a cross-sectional shape of the groove perpendicular to an extending direction of the second gap is a trapezoid having a bottom width greater than an opening width.

6. The display panel according to claim 1, wherein the sub-pixel further comprises:
   a second electrode provided on a side of the light-emitting layer away from the array substrate.

7. The display panel according to claim 1, wherein the array substrate comprises:
   a base substrate;
   a buffer layer provided on the base substrate;
   an active layer provided on a side of the buffer layer away from the base substrate;
   a gate insulating layer provided on a side of the active layer away from the base substrate;
   a gate electrode provided on a side of the gate insulating layer away from the base substrate:
   an interlayer dielectric layer provided on a side of the gate electrode away from the base substrate, wherein a third via hole is provided on the gate insulating layer, and a fourth via hole communicating with the third via hole is provided on the interlayer dielectric layer to expose a part of the active layer; and
   a first source electrode and a first drain electrode provided on a side of the interlayer dielectric layer away from the base substrate, wherein the first source electrode and the first drain electrode are connected to the active layer through the fourth via hole and the third via hole.

8. The display panel according to claim 7, wherein the array substrate further comprises:
   a first passivation layer provided on a side of the first source electrode and the first drain electrode away from the base substrate, wherein a fifth via hole is provided on the first passivation layer to expose the first source electrode and the first drain electrode; and
   a second source electrode and a second drain electrode, arranged on a side of the first passivation layer away from the base substrate, wherein the second source electrode and the second drain electrode are connected to the first source electrode and the first drain electrode through the fifth via hole.

9. A display apparatus comprising a display panel, the display panel comprising:
   an array substrate comprising a switch array formed by a plurality of switch units;
   a planarization layer group provided on the array substrate, wherein a plurality of nano-scale grooves are provided on the planarization layer group; and
   a plurality of sub-pixels provided on a side of the planarization layer group away from the array substrate;
   wherein the sub-pixel comprises a plurality of first electrodes, wherein the first electrode is connected to the switch unit of the array substrate, a nano-scale second gap is provided between two adjacent first electrodes, and an orthographic projection of the second gap on the array substrate is located within an orthographic projection of the groove on the array substrate,
   wherein the sub-pixel further comprises:
   a pixel defining layer provided on a side of the plurality of first electrodes away from the array substrate, wherein a part of the pixel defining layer is filled into the second nap and at least a part of the groove to form an isolation plug, a second via hole is provided on the pixel defining layer to expose the plurality of first electrodes; and
   a light-emitting layer provided in the second via hole of the pixel defining layer and connected to the plurality of first electrodes.

10. The display apparatus according to claim 9, wherein a width of an opening of the groove is smaller than a width of a bottom of the groove.

11. The display apparatus according to claim 10, wherein the planarization layer group comprises:
   a planarization layer provided on the array substrate, wherein a bottom groove is provided on the planarization layer; and
   a second passivation layer provided on a side of the planarization layer away from the array substrate, wherein a nano-scale first gap is provided on the second passivation layer, the first gap communicates with the bottom groove to form the groove, and an orthographic projection of the first gap on the array substrate is located within an orthographic projection of the bottom groove on the array substrate.

12. The display apparatus according to claim 11, wherein a width of the first gap is greater than or equal to 10 nanometers and less than or equal to 50 nanometers; a width of the bottom groove is greater than or equal to 50 nanometers and less than or equal to 100 nanometers, a depth of the bottom groove is greater than or equal to 150 nanometers.

13. The display apparatus according to claim 9, wherein the planarization layer group comprises: a planarization layer made of negative photoresist, wherein the groove is provided on the planarization layer, and a cross-sectional shape of the groove perpendicular to an extending direction of the second gap is a trapezoid having a bottom width greater than an opening width.

14. The display apparatus according to claim 9, wherein the sub-pixel further comprises:
   a second electrode provided on a side of the light-emitting layer away from the array substrate.

* * * * *